United States Patent
Zhu et al.

(10) Patent No.: US 7,597,765 B2
(45) Date of Patent: *Oct. 6, 2009

(54) POST ETCH WAFER SURFACE CLEANING WITH LIQUID MENISCUS

(75) Inventors: Ji Zhu, El Cerrito, CA (US); Seokmin Yun, Pleasanton, CA (US); Mark Wilcoxson, Oakland, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 538 days.

This patent is subject to a terminal disclaimer.

(21) Appl. No.: 11/477,299

(22) Filed: Jun. 28, 2006

(65) Prior Publication Data
US 2007/0240737 A1    Oct. 18, 2007

Related U.S. Application Data

(63) Continuation-in-part of application No. 10/261,839, filed on Sep. 30, 2002, now Pat. No. 7,234,477.

(51) Int. Cl.
*B08B 3/08* (2006.01)
*C23G 1/02* (2006.01)

(52) U.S. Cl. ............................ 134/3; 134/28; 134/34; 134/902

(58) Field of Classification Search ............ 134/2, 134/3, 21, 26, 28, 29, 34, 902; 34/407
See application file for complete search history.

(56) References Cited

U.S. PATENT DOCUMENTS

| | | | |
|---|---|---|---|
| 6,230,720 B1 | 5/2001 | Yalamanchili et al. | 134/1.3 |
| 6,230,722 B1 * | 5/2001 | Mitsumori et al. | 134/122 R |
| 6,247,479 B1 * | 6/2001 | Taniyama et al. | 134/95.2 |
| 6,446,358 B1 * | 9/2002 | Mitsumori et al. | 34/611 |
| 6,517,635 B2 * | 2/2003 | Mitsumori et al. | 134/1 |
| 6,616,772 B2 | 9/2003 | de Larios et al. | 134/21 |
| 6,629,540 B2 * | 10/2003 | Mitsumori et al. | 134/122 R |
| 2003/0168089 A1 | 9/2003 | Katakabe et al. | 134/153 |
| 2005/0139230 A1 | 6/2005 | Miyata et al. | 134/2 |

* cited by examiner

*Primary Examiner*—Joseph L Perrin
(74) *Attorney, Agent, or Firm*—Martine Penilla & Gencarella, LLP

(57) ABSTRACT

A method for cleaning the surface of a semiconductor wafer is disclosed. A first cleaning solution is applied to the wafer surface to remove contaminants on the wafer surface. The first cleaning solution is removed with some of the contaminants on the wafer surface. Next, an oxidizer solution is applied to the wafer surface. The oxidizer solution forms an oxidized layer on remaining contaminants. The oxidizer solution is removed and then a second cleaning solution is applied to the wafer surface. The second cleaning solution is removed from the wafer surface. The cleaning solution is configured to substantially remove the oxidized layer along with the remaining contaminants.

15 Claims, 5 Drawing Sheets

POST ETCH WAFER SURFACE CLEANING WITH LIQUID MENISCUS

CLAIM OF PRIORITY

This is a continuation-in-part application claiming priority from U.S. patent application Ser. No. 10/261,839, filed Sep. 30, 2002, now Pat. No. 7,234,477, issued on Jun. 26, 2007, entitled "Method And Apparatus For Drying Semiconductor Wafer Surfaces Using A Plurality Of Inlets And Outlets Held In Close Proximity To The Wafer Surfaces" by John M. de Larios et al. The aforementioned patent is incorporated by reference in its entirety for all purposes.

BACKGROUND

Semiconductor chip fabrication is a complicated process that involves a coordinated series of precise operations. It is well known that during the various steps in these operations, the surfaces of the semiconductor substrate (i.e., semiconductor wafers) become contaminated with a layer of residue comprised of particulates, organic materials, metallic impurities (e.g. copper, aluminum, titanium, tungsten, etc.), and native oxides (e.g., silicon dioxide).

An example of wafer contamination created as a result of a manufacturing operation can be seen in FIG. 1A, which shows a plasma etching process being employed on a semiconductor wafer 100. Semiconductor wafer 100 is in a plasma etching chamber. The surface of semiconductor wafer 100 is coated with a photoresist material 104 which protects areas of the wafer surface from etching. Etching is a well known method to remove material from the surface of a wafer to create microscopic patterns which conform to an integrated circuit (IC) design. Plasma 110 is directed at the surface of semiconductor wafer 100 to initiate etching on the wafer. Areas of the wafer surface not protected by the photoresist material 104 are etched by plasma 110 to form trench structures in the oxide layer of the semiconductor substrate. The area not protected by photoresist 104 shows that a plume of etched material 102 can form as the result of plasma etching. The plume showers etched material onto the wafer surface and on the sides of the etched trenches. This material can then interact with other contaminants on the wafer to form a contamination film (known as post etch residue).

After plasma etching, photoresist 104 is typically removed through a process called ashing to strip the photoresist material from the wafer surface. FIG. 1B shows the contamination on the wafer surface that can result after plasma etching and ashing operations have completed. As shown in FIG. 1B, the wafer has a variety of contamination species 120 which can include post etch residue, residual photoresist material, sputtered metals, and metal oxides.

Removal of these contaminants is a vital step in producing ICs because contaminants on a wafer surface cause defects in the IC which result in decreased reliability or even failure of the IC. Therefore, the removal of contaminants from the wafer surface is necessary to produce the highest yield of viable devices per wafer.

Proprietary chemical formulations are available to remove post etch residues. However, these formulations are expensive to purchase in sufficient quantities for large scale wafer manufacturing. Furthermore, these proprietary chemicals often take several minutes to effectively remove the contaminants on the wafer surface. This delay can result in lower wafer output which adds to the expense of employing these formulations in the context of large-scale wafer manufacturing. Non-proprietary cleaning chemicals have been utilized in the past for wafer cleaning. However, the amount of contamination that remains on the wafer surface remains unacceptably high unless long process times are provided to clean the wafer surface. This is equally counterproductive to the goal of achieving high throughput wafer manufacture. Therefore in view of the foregoing, there is a need for methods to remove post etch residue chemicals that can effectively clean the surface of a wafer in a timely fashion.

SUMMARY

Broadly speaking, the present invention fills these needs by providing an improved cleaning method to removed contaminants from the surface of a wafer. It should be appreciated that the present invention can be implemented in numerous ways, including as a system, an apparatus and a method. Several inventive embodiments of the present invention are described below.

In one embodiment, a method for cleaning a semiconductor wafer is defined. A proximity head is provided which includes a plurality of source inlets and a plurality of source outlets. Next, the proximity head is defined in close proximity to a wafer surface. After the proximity head is defined in close proximity to the wafer surface, an oxidizer solution is applied through the plurality of source inlets to the wafer surface. The oxidizer solution forms an oxidized layer on one or more contaminant species on the wafer surface. The oxidizer solution is removed from the wafer surface through the plurality of source outlets. Then a cleaning solution is applied to the wafer surface through the plurality of source inlets. The cleaning solution is configured to substantially remove the oxidized layer along with the one or more contaminant species on the wafer surface. The cleaning solution is removed from the wafer surface through the plurality of source outlets.

In another embodiment, a method for cleaning a semiconductor wafer begins by applying to a wafer surface a first cleaning solution to remove one or more contaminant species on the wafer surface. The first cleaning solution is removed from the wafer surface along with at least some of the one or more contaminant species. Next, an oxidizer solution is applied to the wafer surface. The oxidizer solution forms an oxidized layer on remaining contaminant species. The oxidizer solution is removed from the wafer surface. Next, a second cleaning solution is applied to the wafer surface. The second cleaning solution is configured to substantially remove the oxidized layer along with the remaining contaminant species. The second cleaning solution is removed from the wafer surface.

In still another embodiment, a method for cleaning a semiconductor wafer is defined. A proximity head is provided which includes a plurality of source inlets and a plurality of source outlets. The proximity head is defined in close proximity to a wafer surface. Next, a first cleaning solution to remove one or more contaminant species on the wafer surface is applied through the plurality of source inlets to the wafer surface. The first cleaning solution is removed along with at least some of the one or more contaminant species from the wafer surface through the plurality of source outlets. Then, an oxidizer solution is applied through the plurality of source inlets to the wafer surface. The oxidizer solution forms an oxidized layer on remaining contaminant species. The oxidizer solution is removed through the plurality of source inlets. A second cleaning solution is applied through the plurality of source inlets to the wafer. The second cleaning solution is configured to substantially remove the oxidized layer along with the remaining contaminant species. The second cleaning solution is removed from the wafer surface through the plurality of source outlets.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
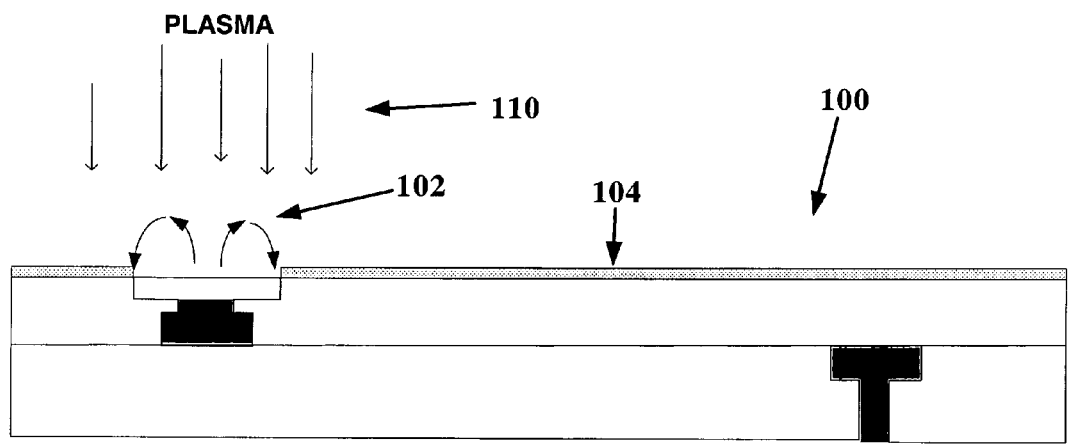
FIG. 1A shows a semiconductor plasma etching manufacturing process on a semiconductor wafer.
Figure 1B:
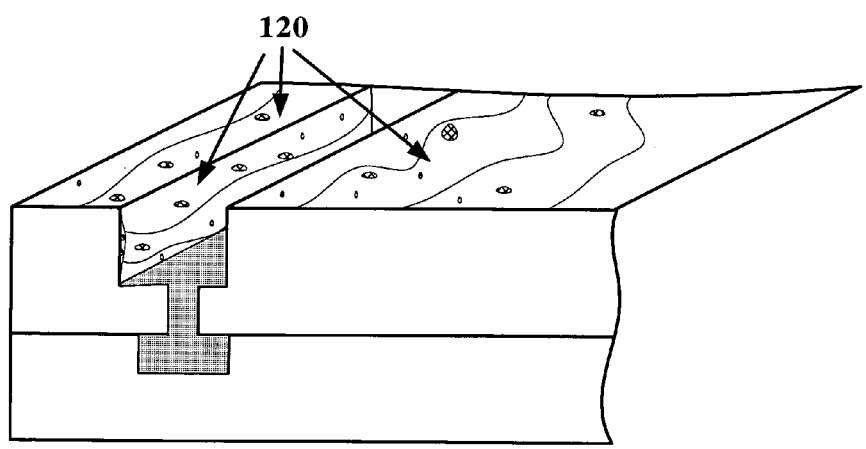
FIG. 1B depicts contaminant residues on a semiconductor wafer after typical plasma etching procedure complete.

An invention is described for apparatuses, systems, and methods for cleaning the surface of a semiconductor substrate. It will be obvious, however, to one skilled in the art, that the present invention may be practiced without some or all of these specific details. In other instances, well known process operations have not been described in detail in order not to unnecessarily obscure the present invention.

A semiconductor substrate can be made of any silicon-based material. In one exemplary embodiment, the substrate is a semiconductor wafer, which is a thin slice of semiconductor material, such as a silicon crystal, upon which microcircuits are constructed by diffusion and deposition of various materials. In this document, the terms semiconductor substrate and semiconductor wafer are used inter-changeably. What is disclosed by the embodiments herein is essentially a semiconductor substrate cleaning method that can be used with customized configurations of proximity heads or other apparatus to economically and efficiently remove contaminants from the surface of a substrate.

Generally speaking, the method applies an oxidizer solution to the wafer surface after the wafer has been contaminated by post etch or other manufacturing processes. The oxidizer solution is selected such that the oxidizer solution causes an oxide layer to form on the wafer surface to entrap contaminants both on the surface of the wafer and within patterned structures. Once the oxide layer forms, the oxide layer can be removed by applying a cleaning solution. In this manner the formation of the oxide layer provides a cooperative cleaning mechanism with the cleaning solution to remove contaminants from the wafer surface. Suitable oxidizers and cleaning solutions can then be chosen so that the combination of oxidizer and cleaning solution work cooperatively to remove contamination from the wafer surface. The selection of a particular oxidizer and cleaning solution can be readily identified if the contamination species on the wafer surface are known.

Practical experience has shown however, that there may be situations where the formation of the initial oxide layer is inhibited by contaminant species. When encountered, this situation necessitates the use high concentrations of oxidizer as much as 5% by weight with process times as high as several minutes. Since oxidizer solutions are relatively expensive, this problem is equally unacceptable as the initial problem of using proprietary cleaning formulations or using cleaning solvents alone. An improvement over the two operation cleaning process is now discussed.

An improvement over the two operation cleaning process is obtained by employing an initial cleaning operation prior to application of the oxidizer solution. After a first cleaning solution is applied to the wafer surface, the first cleaning solution is removed with contaminants that inhibit oxide layer growth. The oxidizer solution can then be applied to the wafer surface so that an oxide layer forms. In general, the initial cleaning process removes contaminants which otherwise would inhibit the formation of the oxide layer. The cleaning method then employs the same oxidizer and cleaning solution treatment that was discussed above. A benefit which makes this process suitable for large scale wafer manufacture is that dilute chemical solutions can be utilized with process times that are below that experienced by previous cleaning methods.

An exemplary list of typical oxidizers employed in accordance with one embodiment of the present invention is listed in Table 1. Hydrogen peroxide, ozone dissolved in water, and nitric acid are listed as examples of typical oxidizers which may be utilized in the present invention. Additional oxidizers can be readily selected and tailored to form an oxide layer over an identified contamination species on a wafer surface.

It should be pointed out that these chemicals are readily available in bulk quantities and in suitable purity levels to employ in large scale wafer manufacture. Additionally the oxidizers listed in Table 1 can be employed in aqueous solutions using existing manufacturing equipment technologies as will be discussed later.

TABLE 1

Exemplary Oxidizer Solutions With Operating Concentrations.

| Chemical | High Concentration | Minimum Concentration | Middle Concentration | Preferred Concentration | Process Time |
| --- | --- | --- | --- | --- | --- |
| H2O2 | 30% by weight | 0.01% by weight | 5% by weight | 0.1% by weight | 1 s-10 s |
| O3 dissolved in water | Saturated | 1 ppm | 10 ppm | 10 ppm | 1 s-10 s |
| Nitric acid | 90% by weight | 5% by weight | 20% by weight | 10% by weight | 1 s-10 s |

An exemplary list of acidic cleaning solutions employed in accordance with one embodiment of the present invention is listed in Table 2. Hydrofluoric acid, acetic acid, nitric acid, and sulfuric acid, an oxalic acid are listed as only examples of typical acidic, cleaning solutions which may be utilized in the present invention. Additional cleaning solutions may also be selected depending on the oxidizer to be dissolved and the nature of the contaminant species on the wafer surface. Example acidic solution should have a pH less than about 7.

Although the examples of Table 2 are acidic cleaning solutions, suitable base cleaning solutions can be employed in the present invention either as the only cleaning solution to be used with the oxidizer solution or in combination with a prior or subsequent cleaning operation employing an acidic cleaning solution. Examples of base cleaning solutions include ST250 and ST255 which are commercial cleaning formulations made by ATMI, Inc. and Rezi-38 which is a commercial cleaning formulation made by the J. T. Baker of Mallinckrodt Baker, Inc. A basic solution should therefore be one that has a pH greater than about 7 or a pH neutral solution. It should be pointed out that these particular formulations are ammonia-based and react well in cleaning copper-based contaminants which may be on a wafer surface. The concentration strength recommended by the manufacturer is used with process times in the range of about 1 s to 120 s for effective cleaning to be achieved.

Referring back to Table 2, the cleaning solutions listed benefit from being readily available in bulk quantities and in suitable purity levels to employ in large scale wafer manufacture. These cleaning solutions also are capable of being delivered in an aqueous solution using existing wafer cleaning technologies.

TABLE 2

Exemplary Cleaning Solutions with Operating Concentrations

| Chemical (Acids) | High Concentration | Minimum Concentration | Middle Concentration | Preferred Concentration | Process Time |
|---|---|---|---|---|---|
| HF | 49% by weight | 0.01% by weight | 1% by weight | 0.049%-0.49% by weight | 0.1 s-60 s with 2-10 s preferred |
| Acetic acid | 50% by weight | 0.01% by weight | 5% by weight | 5% by weight | 0.1 s-60 s with 2-10 s preferred |
| Nitric acid | 50% by weight | 0.01% by weight | 5% by weight | 5% by weight | 0.1 s-60 s with 2-10 s preferred |
| Sulfuric acid | 50% by weight | 0.01% by weight | 5% by weight | 5% by weight | 0.1 s-60 s with 2-10 s preferred |
| Oxalic acid | 50% by weight | 0.01% by weight | 5% by weight | 5% by weight | 0.1 s-60 s with 2-10 s preferred |

Figure 2A:
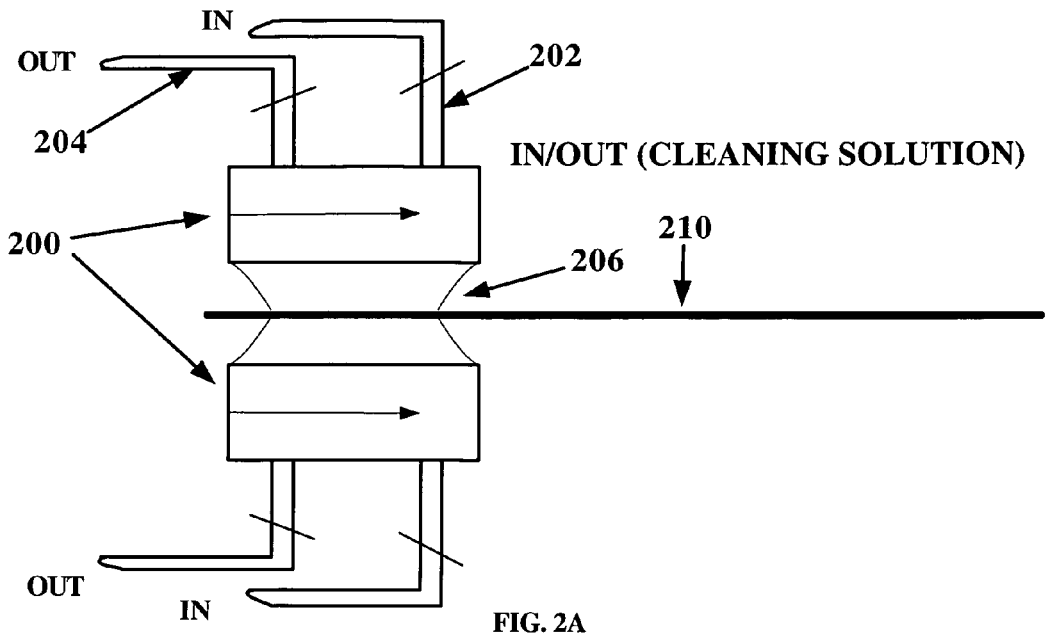
FIG. 2A depicts a proximity head employing cleaning solution to a wafer in accordance with one embodiment of the present invention.

An illustration of a wafer cleaning technology which can used to employ the cleaning solutions and oxidizers listed above is the proximity head developed by Lam Research which is the assignee of the present invention. FIG. 2A depicts a proximity head 200 employing cleaning solution to a wafer 210 in accordance with one embodiment of the present invention. The proximity head 200 has an upper portion and a lower portion which are defined in close proximity to the top and bottom surface of wafer 210. Connected to proximity head 200 are an inlet 202 and an outlet 204. The inlet 202 and outlet 204 route fluids to and from internal channels located inside the proximity head. The internal channels in turn lead to a plurality of source inlets and a plurality of source outlets on the surface of the proximity head that is in close proximity to the wafer surface. These inlets and outlets are configured to deliver and remove fluids in a fashion such that a meniscus forms in the gap between the wafer surface and the proximity head surface. This is shown by meniscus 206 which forms between the top and bottom surface of wafer 210 and proximity head 200. FIG. 2A shows a cleaning solution being applied to wafer 210 in accordance with one embodiment of the present invention. The proximity head can be moved in relation to the wafer surface so that the entire surface of wafer 210 is treated with the cleaning solution. It should be obvious to one skilled in the art that the wafer may be moved instead of the proximity head so that the entire wafer surface can be treated by the cleaning solution.

Figure 2B:
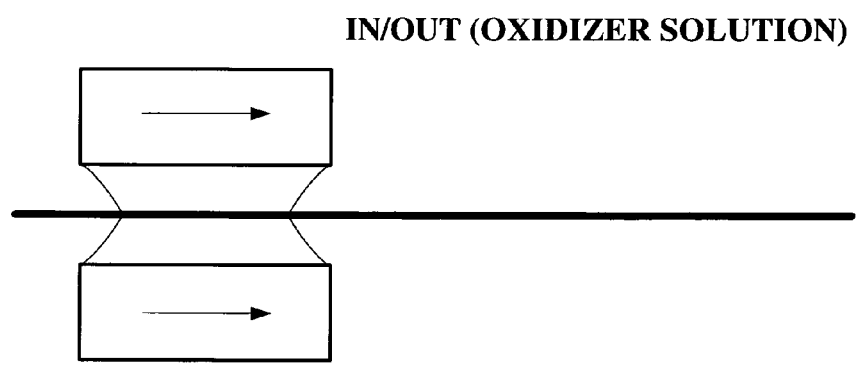
FIG. 2B shows a proximity head employing oxidizer solution to a wafer in accordance with one embodiment of the present invention.
Figure 2C:
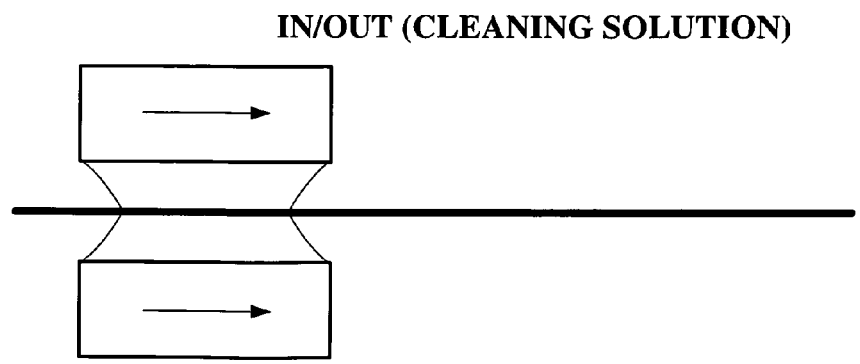
FIG. 2C shows a proximity head employing a second cleaning solution to a wafer in accordance with one embodiment of the present invention.

Likewise, FIG. 2B shows an oxidizer solution being applied to a wafer in accordance with one embodiment of the present invention. A proximity head is used to deliver and remove oxidizer solution to the wafer surface. FIG. 2C illustrates a cleaning solution being applied in accordance with one embodiment of the present invention. It should be understood that the inlets and outlets of FIG. 2A are present in FIGS. 2B and 2C and have only been excluded from illustration for convenience.

Figure 3A:
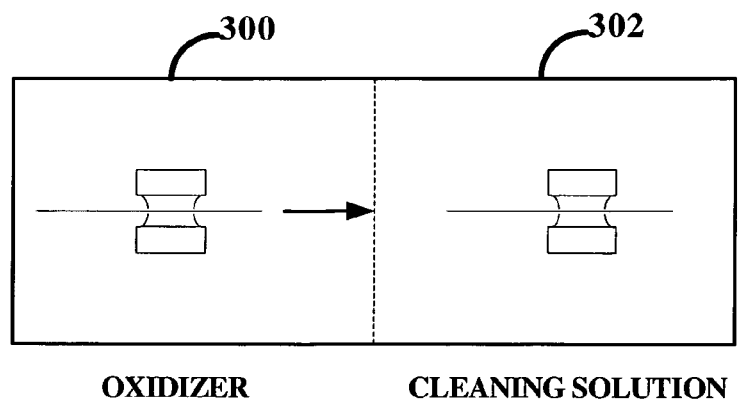
FIG. 3A depicts a wafer cleaning station employing a two station wafer surface cleaning operation in accordance with one embodiment of the present invention.
Figure 3B:
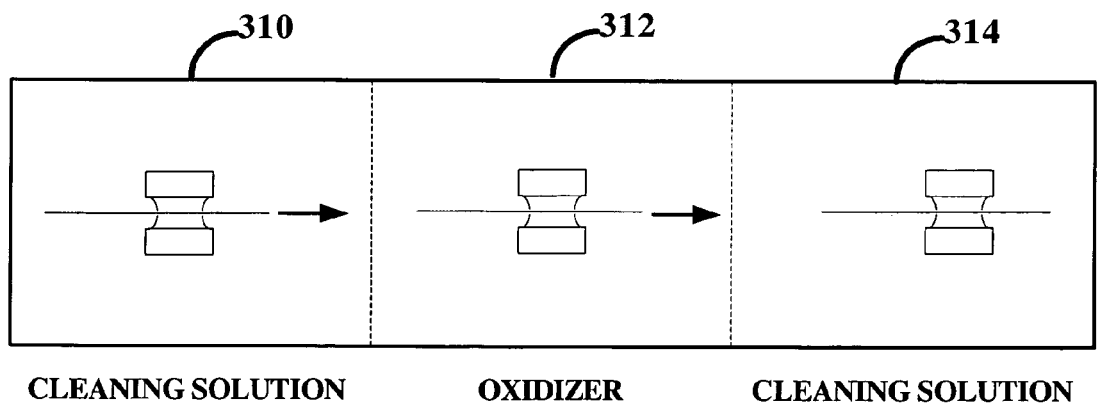
FIG. 3B depicts a wafer cleaning station employing a three station wafer cleaning operation in accordance with one embodiment of the present invention.

FIGS. 3A and 3B depict further embodiments of wafer cleaning technology which employ proximity heads. FIG. 3A depicts a wafer cleaning station employing a two station wafer surface cleaning operation in accordance with one embodiment of the present invention. In cleaning station 300 an oxidizer solution is simultaneously applied and removed from a wafer surface through the use of a proximity head. After the oxide layer has been formed on the surface of the wafer, the wafer is transferred to cleaning station 302 where a second proximity head simultaneously applies and removes a cleaning solution. It should be understood that the cleaning solution removed by the proximity head includes dissolved oxide layer and contaminants. After the wafer is cleaned in cleaning station 302, it can be transferred for further manufacturing processing.

FIG. 3B depicts a wafer cleaning station employing a three station wafer cleaning operation in accordance with one embodiment of the present invention. In cleaning station 310 an initial cleaning process employs a proximity head to deliver and remove a cleaning solution. The cleaning solution removed by the proximity head is dirty with contaminants that were dissolved or loosened from the wafer surface by the application of the cleaning solution. The wafer is then transferred to station 312 where an oxidizer solution is applied and removed by a second proximity head. After sufficient time has been allowed for an oxide layer to form, the wafer is transferred to cleaning station 314. In cleaning station 314 a third proximity head applies cleaning solution to the wafer. After the wafer is cleaned in cleaning station 314, it can be transferred for further manufacturing processing. It should be understood that FIGS. 3A and 3B do not depict the only possible configuration of cleaning stations. Additional configurations are possible which employ physical scrubbing and ultrasonic cleaning devices.

Figure 4:
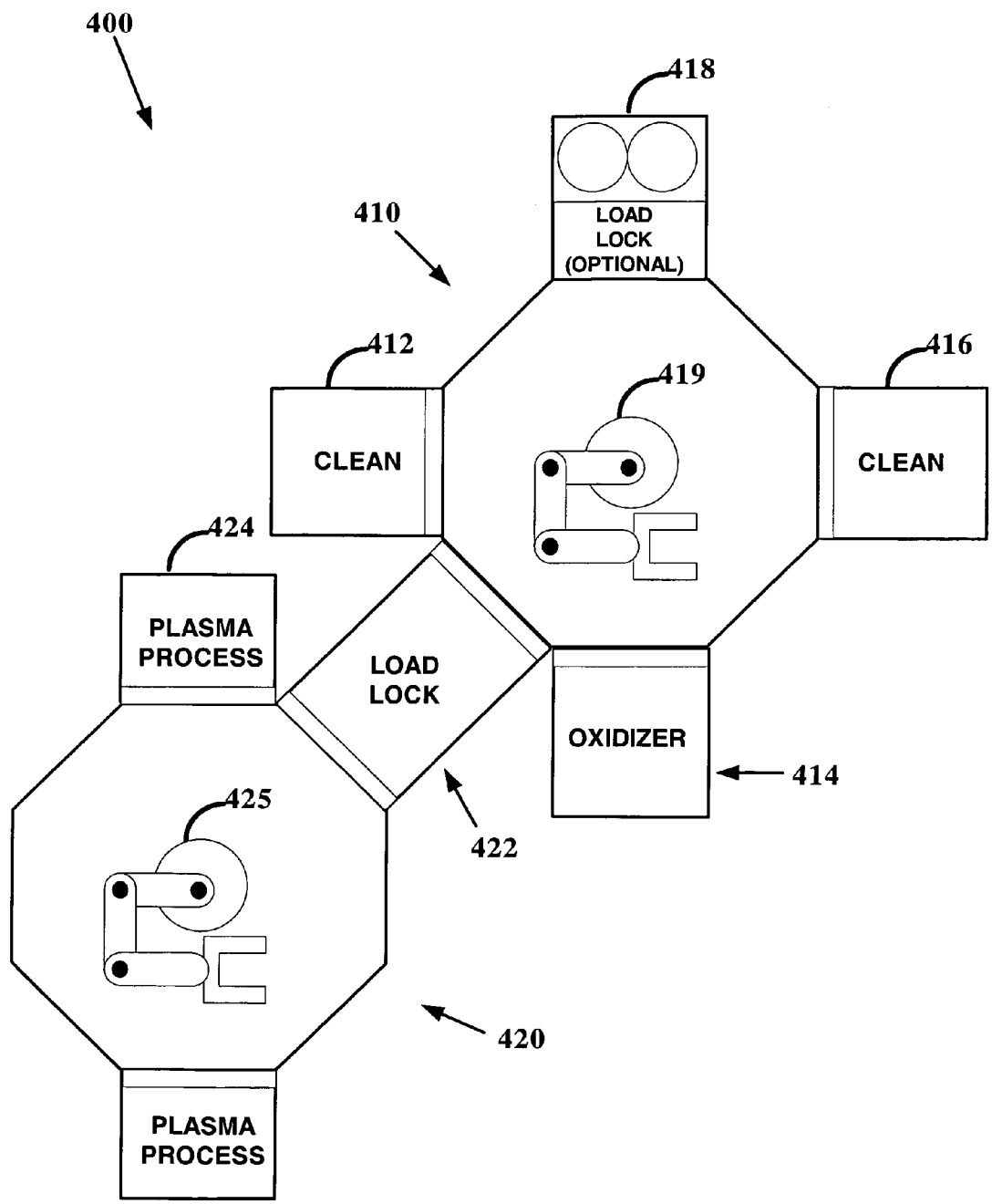
FIG. 4 depicts a multi-chambered, automated wafer cleaning station with an associated cluster attachment in accordance with one embodiment of the present invention.

FIG. 4 depicts a manufacturing cell 400 which is comprised of a multi-chambered, automated wafer cleaning station 410 with an associated cluster attachment 420 in accordance with one embodiment of the present invention. Cleaning station 410 contains multiple chambers on the periphery of a central chamber which in turn contains a wafer transfer robot arm 419. A load lock 422 connects cleaning station 410 to a cluster attachment 420 which contains multiple chambers on the periphery of a central chamber which contains a wafer transfer robot 425. The multiple chambers attached to the central chamber of cluster attachment 420 are dedicated to wafer processing operations. For example, chamber 424 employs a plasma process for plasma etching of trenches on wafer surfaces. As may be needed, after a wafer has completed one or more processing operations in cluster attachment 420, wafer transfer robot 425 will transfer a contaminated wafer so that it may be cleaned in cleaning station 410. The wafer passes through the load lock 422 and is transferred by wafer transfer robot 419 to either a clean chamber or an oxidizer chamber depending on whether a two-operation, surface cleaning process or a three-operation, surface cleaning process is to be employed. Wafer transfer robot 419 may transfer the cleaned wafer after cleaning operations have been completed to a wafer storage unit 418 where wafers can be either manually or automatically transferred for further manufacturing operations. It should be understood that FIG. 4 only illustrates one possible configuration of a manufacturing cell and that other combinations are compatible with the operations of the present invention.

Figure 5A:
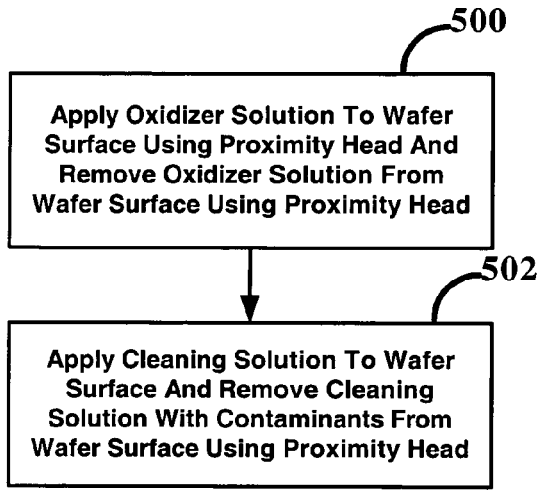
FIG. 5A is a flowchart of a wafer cleaning process employing an oxidizer and cleaning solution in accordance with one embodiment of the present invention.

FIG. 5A is a flowchart of a wafer cleaning process employing an oxidizer and cleaning solution in accordance with one embodiment of the present invention. In operation 500 an oxidizer solution is applied to a wafer surface using a proximity head. By virtue of the configuration of the proximity head, the oxidizer solution will simultaneously applied and removed from the wafer surface. After sufficient time has been given in operation 500 to allow for an oxide layer to form on the wafer surface, operation 502 proceeds. At this point, an optional DI water rinse operation may be performed. This optional step may provide more efficient processing of subsequent operations. In operation 502 a cleaning solution is applied to the wafer surface and removes the cleaning solution along with contaminants from the wafer surface using a proximity head. By virtue of the configuration of the proximity head both the application and removal actions occur simultaneously. The cleaning solution may be either a base solution or an acidic solution depending on the oxidizer chosen and the contaminant species that are present on the wafer.

Figure 5B:
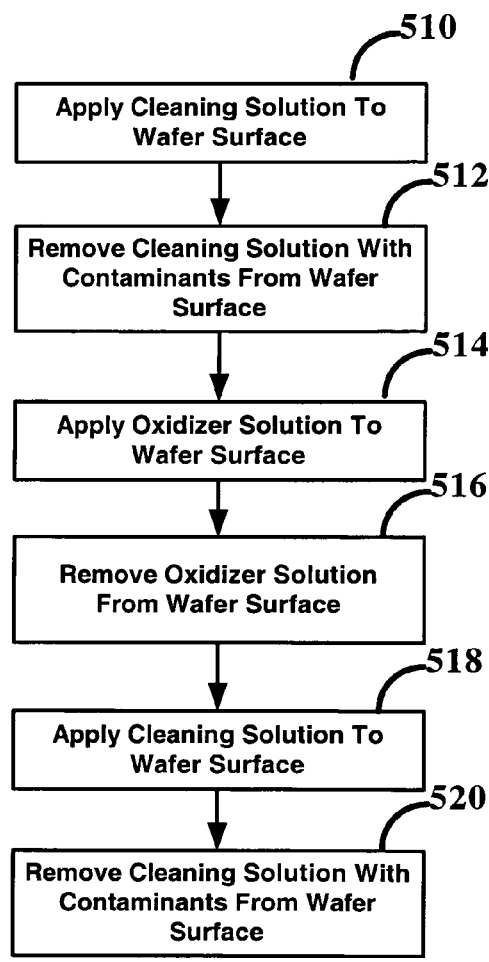
FIG. 5B is a flowchart of a cleaning process employing a first cleaning solution, an oxidizer and a second cleaning solution in accordance with one embodiment of the present invention.

FIG. 5B is a flowchart of a cleaning process employing a first cleaning solution, an oxidizer, and a second cleaning solution in accordance with one embodiment of the present invention. In operation 510 a cleaning solution is applied to a wafer surface. The cleaning solution may be either a base solution or an acidic solution depending on the contaminant species that are present on the wafer. The cleaning solution is removed With contaminants from the wafer surface in operation 512. Next an oxidizer solution is applied to the wafer surface. Preferably, the oxidizer solution is a dilute solution as illustrated in Table 1. Once sufficient time has been given to allow an oxide layer to form on the wafer surface, the oxidizer solution is removed from the wafer surface in operation 516. After operation 516 completes, a second cleaning solution is applied in operation 518. It should be understood that the cleaning solution may be the same or a different cleaning solution as was employed in operation 510. If only one cleaning solution is to be used to clean a wafer surface, different concentration levels of the cleaning solutions may be employed in operations 510 and 518. After the cleaning solution is applied in operation 518, operation 520 completes the cleaning process by removing the cleaning solution with the contaminants from the wafer surface.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent application, which is assigned to Lam Research Corporation, the assignee of the subject application, is incorporated herein by reference.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims. Additionally, the operational steps disclosed in the method claims herein do not follow any predetermined order and may be practiced in any order appropriate to the specific application.

What is claimed is:

1. A method for cleaning a semiconductor wafer, comprising:

providing a proximity head which includes a plurality of source inlets and a plurality of source outlets, the proximity head including a head surface from which the plurality of source inlets are formed;

moving the proximity head in close proximity to a wafer surface;

applying through the plurality of source inlets to the wafer surface an oxidizer solution, the oxidizer solution forming an oxidizer meniscus between the head surface of the proximity head and the wafer surface, the oxidizer solution further forming an oxidized layer on one or more contaminant species on the wafer surface;

removing the oxidizer solution from the wafer surface through the plurality of source outlets, the removing of the oxidizer solution between performed during the applying of the oxidizer solution so that the oxidizer meniscus remains between the head surface and the wafer surface during the applying and removing of the oxidizer solution;

performing a DI water rinse operation;

applying through, through a plurality of source inlets of a second proximity head, to the wafer surface, a cleaning solution, the second proximity head having head surface; and removing the cleaning solution from the wafer surface through a plurality of source outlets of the second proximity head, the removing of the cleaning solution being performed during the applying of the cleaning solution to define a cleaning meniscus between the head surface and the wafer surface, and the cleaning solution being defined to substantially remove the oxidized layer along with the one or more contaminant species on the wafer surface with the cleaning meniscus.

2. The method of claim 1, wherein the oxidizer solution is hydrogen peroxide in a concentration range of about 0.01% to about 30% by weight.

3. The method of claim 1, wherein the oxidizer solution is ozone dissolved in water with an ozone concentration in a range of about 1 part per million to saturation.

4. The method of claim 1, wherein the oxidizer solution is nitric acid in a concentration range of about 5% to about 90% by weight.

5. The method of claim 1, wherein the cleaning solution is at least one of hydrofluoric acid in a concentration range of about 0.01% to about 49% by weight or acetic acid, sulfuric acid, and oxalic acid in a concentration range of about 0.01% to about 50% by weight.

6. A method for cleaning a semiconductor wafer, comprising;
- providing one or more proximity heads, each proximity head including a head surface, the head surface including a plurality of discrete inlets and outlets, the head surface configured to be placed in proximity to a surface of the semiconductor wafer;
- applying to a wafer surface a first cleaning solution through one of the proximity heads to remove one or more contaminant species on the wafer surface;
- removing the first cleaning solution from the wafer surface along with at least some of the one or more contaminant species through one of the proximity heads, the applying and removing of the first cleaning solution defining a first cleaning solution meniscus between the wafer surface and the head surface;
- applying to the wafer surface an oxidizer solution through one of the proximity heads, the oxidizer solution forming an oxidized layer on remaining contaminant species;
- removing the oxidizer solution from the wafer surface through one of the proximity heads, the applying and removing of the oxidizer solution defining an oxidizer solution meniscus between the wafer surface and the head surface;
- applying to the wafer surface a second cleaning solution through one of the proximity heads; and
- removing the second cleaning solution from the wafer surface through one of the proximity heads, the applying and removing of the second cleaning solution defining a second cleaning solution meniscus between the wafer surface and the head surface, the second cleaning solution being configured to substantially remove the oxidized layer along with the remaining contaminant species.

7. The method of claim 6, further comprising:
- performing a DI water rinse operation after the removing of the oxidizer solution from the surface of the wafer and before the second cleaning solution is applied to the wafer surface.

8. The method of claim 6, wherein the oxidizer solution is hydrogen peroxide in a concentration range of about 0.01% to about 30% by weight.

9. The method of claim 6, wherein the oxidizer solution is ozone dissolved in water with an ozone concentration in a range of about 1 part per million to saturation.

10. The method of claim 6, wherein the oxidizer solution is nitric acid in a concentration range of about 5% to about 90% by weight.

11. The method of claim 6, wherein the first cleaning solution and the second cleaning solution are each at least one of hydrofluoric acid in a concentration range of about 0.01% to about 49% by weight or acetic acid, sulfuric acid, and oxalic acid in a concentration range of about 0.01% to about 50% by weight.

12. The method of claim 6 wherein the first cleaning solution is an acidic solution and the second cleaning solution is a base solution.

13. The method of claim 6, wherein the first cleaning solution is a base solution, and the second cleaning solution is an acidic solution.

14. A method for cleaning a wafer, comprising;
- providing one or more proximity heads, each proximity head including a head surface, the head surface including a plurality of discrete inlets and outlets, the head surface configured to be placed in proximity to a wafer;
- applying a first cleaning solution to a surface of the wafer through one of the proximity heads to remove one or more contaminant species from the surface of the wafer;
- removing the first cleaning solution from the surface of the wafer along with at least some of the one or more contaminant species through one of the proximity heads, the applying and removing of the first cleaning solution defining a first cleaning solution meniscus between the surface of the wafer and the head surface;
- applying to the surface of the wafer hydrogen peroxide through one of the proximity heads, the hydrogen peroxide forming an oxidized layer on remaining contaminant species;
- removing the hydrogen peroxide from the surface of the wafer through one of the proximity heads, the applying and removing of the hydrogen peroxide defining a hydrogen peroxide meniscus between the surface of the wafer and the head surface, the hydrogen peroxide having a concentration range of about 0.01% to about 30% by weight;
- applying to the surface of the wafer a second cleaning solution through one of the proximity heads; and
- removing the second cleaning solution from the surface of the wafer through one of the proximity heads, the applying and removing of the second cleaning solution defining a second cleaning solution meniscus between the surface of the wafer and the head surface, the second cleaning solution being configured to substantially remove the oxidized layer along with any contaminant species.

15. The method of claim 14, wherein the first cleaning solution and the second cleaning solution are each at least one of hydrofluoric acid in a concentration range of about 0.01% to about 49% by weight or acetic acid, sulfuric acid, and oxalic acid in a concentration range of about 0.01% to about 50% by weight.

* * * * *